United States Patent [19]
Williams

[11] Patent Number: 6,140,822
[45] Date of Patent: Oct. 31, 2000

[54] SYSTEM FOR SIGNAL PATH CHARACTERIZATION WITH A REFERENCE SIGNAL USING STEPPED-FREQUENCY INCREMENTS

[76] Inventor: Thomas H. Williams, 6423 Fairways Dr., Longmont, Colo. 80503

[21] Appl. No.: 09/188,163

[22] Filed: Nov. 7, 1998

Related U.S. Application Data

[63] Continuation-in-part of application No. 08/865,237, May 29, 1997, Pat. No. 5,990,687, and a continuation-in-part of application No. 08/999,912, Dec. 6, 1997.
[60] Provisional application No. 60/072,419, Jan. 24, 1998.
[51] Int. Cl.[7] .................................................. G01R 27/00
[52] U.S. Cl. ........................... 324/620; 324/626; 324/627
[58] Field of Search .................................... 348/192, 193, 348/613, 622, 609; 455/67.1, 67.3, 67.4; 324/344, 627, 637, 76.13, 76.21, 76.27, 76.39, 76.51, 620, 625, 626; 73/75, 76, 79, 189

[56] References Cited

U.S. PATENT DOCUMENTS

| | | | |
|---|---|---|---|
| 4,344,028 | 8/1982 | Bank et al. | 324/620 |
| 5,066,921 | 11/1991 | Rope et al. | 324/639 |
| 5,121,211 | 6/1992 | Koo . | |
| 5,179,444 | 1/1993 | Koo . | |
| 5,510,700 | 4/1996 | Pomatto | 324/66 |

OTHER PUBLICATIONS

Proofing and Maintaining Upstream Cable Plant with Digital Signal Analysis Techniques, by Thomas H. Williams, 49th ARFTG Conference Digest, Spring 97 Analog Devices AD9850 Data Sheet, 1996 No Month Available.

Testing Coaxial Shielding Integrity by Sheath Current Induction by Tom Williams and David Bell SCTE Cable Tech Expo 1998 Proceedings Manual (Jun. 1998).

Product Literature from Microwave & RF Magazine Sep. 1998, p. 166.

Product Literature Downloaded from the Stanford Telecom Internet Site (www) on Nov. 10, 1998 2 pages.

*Primary Examiner*—Safet Metjahic
*Assistant Examiner*—Vincent Nguyen

[57] ABSTRACT

A system that utilizes a reference signal for testing signal paths for complex frequency response (linear distortion), and non-linear distortion. This reference signal, which is also known as a ghost canceling reference signal or a training waveform, has excellent properties for channel characterization. The reference signal is a waveform that operates for a major time interval that is subdivided into multiple minor time intervals. During each minor time interval, a sine wave oscillates at a constant angular velocity or frequency. The sine wave frequency may take uniform steps between the minor time intervals, or it may skip a group of frequencies. The phase of the waveform may optionally be continuous between the end of one minor time interval and the start of the next minor time interval. This waveform is generated by loading the time sample values from a digital memory into a digital to analog converter (D-A), or by rapidly reprogramming a numerically-controlled oscillator. The reference signal can also be analyzed for the presence of non-linear distortion. Broadband RF channels, such as cable television channels, or baseband channels, such as telephone channels may be characterized using this waveform.

14 Claims, 11 Drawing Sheets

PRIOR ART FIG 2

SYSTEM FOR SIGNAL PATH CHARACTERIZATION WITH A REFERENCE SIGNAL USING STEPPED-FREQUENCY INCREMENTS

This patent application is a continuation in part of U.S. patent application Ser. No. 08/865,237 filed May 29, 1997 now U.S. Pat. No. 5,990,687 and titled "Measuring Shield Breaks in Coaxial Cable by a Sheath Test Current". This patent application is also a continuation in part of U.S. patent application Ser. No. 08/999,912 filed Dec. 6, 1997 and titled "Test System for Measuring Frequency Response and Dynamic Range on Cable Plant". This patent application is also a continuation in part of provisional patent application 60/072,419 filed Jan. 24, 1998 and titled "Test for Non-Linear Distortion Using Digital Signal Processing".

BACKGROUND

1. Field of the Invention

The present invention relates to systems that may be used to characterize a signal path for a linear frequency response and a non-linear saturation level. More particularly, this invention relates to general-purpose test methods that can be used to characterize wide-bandwith signal paths such as the frequency bands in forward or reverse two-way cable systems, the frequency bands in a wireless transmission system, or to measure the shielding integrity of coaxial cable by a sheath current induction method.

BACKGROUND

2. Description of Prior Art

Test systems frequently use repeatable signals that are called reference signals, ghost canceling reference signals (GCR's), or training signals to measure the frequency response of a signal path. A signal path typically includes a transmitter, a transmission medium, and a receiver. In the case of broadcast wireless signals, the signal path also includes a transmitter antenna and a receiver antenna and the transmission medium may be free space. In the case of hybrid fiber coaxial (HFC) cable systems, the transmission medium may include both coaxial cable and fiber optic lines. The test systems typically use an unimpaired copy of the reference signal which is stored at the receive site to calculate the frequency response. The linear frequency response includes the magnitude flatness and phase non-linearity versus frequency.

Frequency and phase response are important to know because variations in either amplitude flatness or phase linearity are linear distortions which cause signals sent through the signal path to be distorted. Group delay is a measure of phase linearity. Group delay is the derivative, or slope, of the phase with respect to frequency. If the transmitted signals are in digital form, this linear distortion creates a problem known as inter-symbol interference. If the inter-symbol interference is moderate, the data error rate will be increased in a channel with random noise. If the inter-symbol interference is severe, the data will have such a high error rate that the data is rendered useless. Linear distortion can occur because of echoes. Echoes are also known as multi-path distortion or reflections. Linear distortion also occurs because of filters or other tuned or frequency-sensitive elements. Higher order modulation methods, such as 64-QAM (quadrature amplitude modulation) and 16-VSB (vestigial sideband), are more sensitive to un-corrected echoes than lower order modulation methods, such as QPSK (quadrature phase shift keying).

Linear distortions can be canceled by means of a circuit or device known as an adaptive equalizer, which must be programmed. Adaptive equalizers may be of the finite impulse response (FIR) type, infinite impulse response (IIR) type, or a combination of both types. In order to program the adaptive equalizer, it is necessary to know the value of the tap coefficients. One way tap coefficients can be determined is by an analysis of a reference signal. This is done by analyzing a transmitted reference signal that was passed through the unknown signal path along with a stored unimpaired copy of the reference signal. *Adaptive Filter Theory* by Simon Haykin (published by Prentice Hall, 1996, 3rd edition) explains the theory of adaptive equalizers.

One prior art processing method for a frequency response analysis using a reference signal is as follows. First, the reference signal is impaired by passing it through the signal path under test and capturing it as a series of digital time samples using an analog-to-digital converter. Second, the stored unimpaired reference signal and the captured impaired test reference signal are both converted into the frequency domain by means of the discrete Fourier transform. The discrete Fourier transform, which may be a fast Fourier transform (FFT) takes discrete time samples and converts them into discrete complex frequency samples. Commonly, the number of points that comprise a transform block is 2 raised to some power of an integer, n. For example, n may be 2048 or 4096 points. Third, the test impaired reference signal is divided, using complex division, by the unimpaired reference signal on a frequency-by-frequency basis. The result is the frequency response of the channel, which is a complex number with a magnitude and phase for each frequency. If the channel is perfect, the magnitude will be 1.0 at all frequencies. If the phase is linear, the group delay will be zero at all frequencies. If the complex frequency response is converted back into the time domain using the inverse fast Fourier transform (IFFT), the impulse response of the channel can be determined. The impulse response is the time domain response of the signal path to an impulsive input and can be examined for the presence of echoes or other linear distortion. The impulse response may be viewed as the dual of the complex frequency response in the time domain. If the reciprocal of the complex frequency response is transformed into the time domain with the IFFT, the coefficients to program the taps on an adaptive equalizer, such as a FIR filter, can be determined. The adaptive equalizer is typically located in the receiver circuitry, whereby the impaired signal is corrected at the receive site. It may also be located in the transmitter's circuitry, wherein the transmitted signal is pre-distorted so it will arrive at the receiver without linear distortion.

The signal path may be at baseband, such as a telephone connection or an acoustic path between a loudspeaker and a member of the audience in an auditorium. Likewise, the signal path may be at radio frequencies (RF). RF signal paths may use any linear modulation technique such as single sideband, vestigial sideband, or double sideband modulation. For example the 8-VSB (vestigial sideband) signal is used as a broadcast transmission method for high definition television signals in the United States. Likewise, 64-QAM and 256-QAM (quadrature amplitude modulation) are used as methods for carrying data and entertainment signals over HFC cable lines. The adaptive equalizer may also be used to equalize a signal path for analog signals, such as NTSC (National Television Systems Committee) picture transmissions, as well as for the digital signals mentioned above. If the RF signal path uses both an in-phase (I) signal component and a quadrature (Q) signal component, the adaptive equalizer may employ 4 FIR filters to provide I to I, Q to Q, I to Q, and Q to I equalization. The signal path may include the circuits in the transmitter and receiver, as well as the transmission medium.

Reference signals can also be used for channel characterization without any intention of programming the taps of an adaptive equalizer or correcting the channel. For example, a reference signal can be used as a test signal or a diagnostic signal. Reference signals can also be used to measure time delay if the test system can provide a trigger signal with a constant transit time. Radar and sonar are examples of systems that measure time delay.

Various waveforms can be used as reference signals. The typical characteristics that make a good reference signal are high overall energy relative to peak-to-peak voltage and high energy at all frequencies. That is, it is typically undesirable to have a frequency or a frequency band that has low energy. Low energy is a problem because of the division process in step 3 above. If the energy at some frequency is zero, the computer generates a division by zero error. If the energy is very small, the effect of any noise contaminating the numerator coefficient will be exaggerated. High energy relative to peak-to-peak voltage is important because a high peak voltage may clip or distort any amplifier in the channel, creating non-linear distortion. Non-linear distortion is not canceled by adaptive equalizers, and non-linear distortion contaminates the results of a linear distortion test by reducing the accuracy of the characterization.

An impulse, which has the shape of a sin(x)/x in a band-limited channel, can be used as a reference signal. The impulse has a disadvantage of being low in overall energy relative to peak voltage, but it is easy to analyze, and it has uniform energy in all frequency bands. A pseudo-noise (PN) sequence is another good waveform to use as a reference signal. The PN sequence can be generated inexpensively from digital integrated circuits (ICs). PN sequences are noise-like signals that have high overall energy relative to peak voltage but typically have frequencies with low energy.

A multiburst is a waveform that has been used for many years to characterize the frequency response of a television transmission's signal path. The multiburst waveform is comprised of six bursts of fixed-frequency sine waves with a dead-zone or "breezeway" between each of the bursts. The breezeway allows one burst to be clearly distinguished from the burst preceding it or the burst following it. This signal is commonly used in the vertical blanking interval (VBI) of NTSC television transmissions as a vertical interval test signal (VITS). Observation of this signal provides an estimate of the amplitude response at 6 frequencies corresponding the six bursts comprising a multiburst.

The Koo waveform is a signal invented by David Koo and described in U.S. Pat. No. 5,179,444. This waveform has uniform energy at all frequencies within a frequency range, has high overall energy relative to peak-to-peak voltage. This waveform is used as the reference signal for characterizing echoes in analog NTSC television channels in the United States. It is carried on line 19 of the VBI.

Another waveform that can be used as a reference signal is a quadratic chirp. This waveform has the characteristic whereby the instantaneous frequency of the signal increases linearly with time. This implies that the phase increases proportional to time squared:

$$v(t)_{t=t_1}^{t=t_2} = a \cdot \text{Cos}(\phi_0 + \omega t^2) \qquad (1)$$

where v is the voltage, 'a' is the peak amplitude of the signal, t is time, $\omega$ is the angular frequency, and $\phi_0$ is the starting phase.

This waveform, like the Koo waveform, has the characteristics of high energy relative to peak-to-peak voltage. It also has relatively flat energy with respect to frequency, although not quite as good as the Koo waveform.

The disadvantage that both the Koo waveform and the quadratic chirp have is that they are most accurately generated by computing their discrete time values by mathematical formulas and storing the values in an electronic memory, such as a random access memory (RAM) or a read only memory (ROM). When they are needed, the time sample values are pulled from the electronic memory and applied to a D-A (digital to analog) converter which creates the desired waveform. A lowpass filter after the D-A converter removes aliasing components. The disadvantage of this generation method is that if the sample rate is high, an expensive D-A converter and high-speed memory chips are required. High sample rates are needed to generate wide-bandwidth signals to characterize broadband signal paths such as forward and reverse cable systems. In the United States, the forward portion of a cable system might use the 54–750 MHz frequency band, while the reverse portion of a cable system might use 5–42 MHz.

Frequently, the linear frequency response of a signal path does not completely characterize the signal path. If a channel is being overloaded or clipped, the non-linear distortion products will also cause inter-symbol interference. There are several prior art methods that can be used to determine if a network is being clipped or operated at a too-high signal level. Test systems typically do not use reference signals to determine the non-linear saturation level, which is the signal level at which excessive distortion components are created.

One prior art way to measure the dynamic range of a signal path is to transmit a sine wave and inspect for the presence of harmonics of the sine wave at the receive site. Another prior art method is a notch filter test which uses a broadband random noise source and a notch filter placed between the random noise source and the signal path. The notch filter removes the energy in a portion of the frequency band. The random noise source is elevated in level until network distortion energy at the receive site begins to "fill-in" the spectral hole created by the notch filter. The signal level at which the energy in the notch reaches some predetermined level establishes the network's clipping level. A measurement of the notch depth can be made with a spectrum analyzer. Unfortunately, the high-quality notch filters required to do the test are frequently expensive and bulky.

A special-purpose waveform, called a modulated staircase, is used to measure the non-linear performance of analog television signal paths. Typically, high-powered transmitters are most culpable for the creation of non-linear distortion on analog television transmission systems. The modulated staircase is used to measure non-linear distortion expressed as a differential gain and a differential phase of the signal.

Thus, there is a need in the art for a broadband high-speed waveform that can be easily generated at low cost and with excellent properties as a reference signal. There is also a need for a reference signal that can be used to measure the level of non-linear distortion in a signal path.

SUMMARY OF THE INVENTION

It is an aspect of this invention to provide a system for characterizing a signal path for linear and non-linear distortion.

It is also an aspect of this invention to disclose a novel reference signal that is a waveform with high energy, low peak signal levels, and relatively uniform energy for characterizing signal paths for frequency response and delay.

It is also an aspect of this invention to provide a system for characterizing a channel for non-linear impairments.

It is also an aspect of this invention to disclose an efficient low-cost method of generating this novel reference waveform.

A system for characterizing a frequency response of a signal path comprising a reference signal with a major time block which is further subdivided into a plurality of smaller minor time blocks, a sine wave that oscillates at a constant frequency during each of the minor time blocks and changes frequency between minor time blocks, and a method of generating this waveform by rapidly re-programming a numerically controlled oscillator.

DRAWING FIGURES

DESCRIPTION OF THE PREFERRED EMBODIMENT

In the earlier U.S. patent application Ser. No. (08/865,237, May 29, 1997) now U.S. Pat. No. 5,990,687, of which this patent application is a continuation in part, a method was disclosed to determine if there is a break in a coaxial cable's shielding by inducing a sheath current signal onto the outside of the coaxial cable. A broadband reference signal transmitter drives a primary winding that passes through a magnetic core. A coaxial cable that is being tested is also passed through the magnetic core, forming a secondary winding on a transformer. A sheath break is ascertained by testing with a receiver for the presence of the induced signal on the center conductor. Since sheath breaks tend to produce frequency-selective responses and since the repair process can be aided by information about the distance to the break, a wide bandwidth reference signal is used as the sheath current test signal. In the past, a PN sequence has been used as the reference test signal. Thus, the path between transmitter and receiver, which includes the magnetic core, the outside of the coaxial cable, the sheath break point, and the inside of the coaxial cable can be considered as a signal path. A test system to perform this test is offered commercially and called the "Cable Scope™". A technical paper describing the results of field testing with the sheath current induction method is described in the SCTE Cable Tech Expo. 1998 the Proceedings Manual on pages 441–455 titled "Testing Coaxial Cable Shielding Integrity by Sheath Current Induction" by Thomas H. Williams and David Bell.

The same Cable Scope transmitter and receiver devices that are used for the sheath current induction test can also be used to measure the frequency response of a reverse cable system. This may be done by transmitting the reference signal upstream from a tap near a house, receiving the reference signal at the cable headend, and analyzing the received signal on a personal computer connected to the receiver. The analysis process uses an unimpaired version of the reference test signal. A digital oscilloscope is used as the receiver device.

The same Cable Scope transmitter and receiver devices that are used for sheath current induction tests can also be used to measure reflected signals by connecting the transmitter output and the receiver input to a device called a return loss bridge. Thus, the return loss bridge is included in the signal path, and the test system allows the return loss to be measured, as well as any delay associated with the reflection.

A test system, such as Cable Scope™, equipped with a training signal according to the present invention can be used for all three above mentioned testing methods with superior results because of the excellent characteristics of this novel reference signal.

Figure 1:
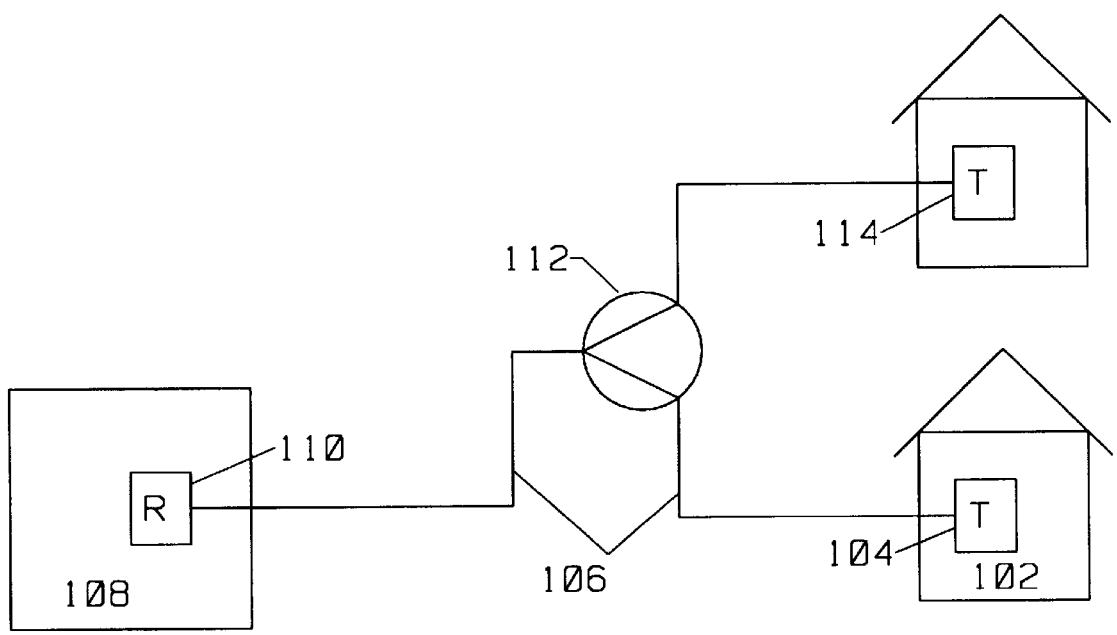
FIG. 1 is a block diagram of a transmitter, transmission medium, and receiver.

FIG. 1 illustrates one of many possible transmission systems that could employ a transmission system of the present invention. The transmission system consists of a transmit location 102, wherein a transmitter device may be located. As an example, this could be a home in a HFC Cable system. Located in the home is a home terminal device 104 which is a transmitter in an upstream direction in the 5–42 MHz frequency band. The home terminal device could be a cable modem, set-top box, cable phone, or a device for any number of other applications. The home terminal device 104 may also contain a receiver for receiving in a 54–750 MHz downstream frequency band. Alternately, the transmit location could be the site at which a Cable technician inserts a test signal. The signal transmission propagates through a transmission medium 106, which may be coaxial cable and fiber optic cable back to a headend reception point 108 wherein a receiver 10 is located. The receiver could be used to provide services or a diagnostic piece of test equipment. Splitter-combiner 112 is used to split signals traveling in the downstream direction and combine signals in the upstream direction. Thus the receiver 10 may be shared by several transmitters such as a second transmitter 114.

Figure 2:
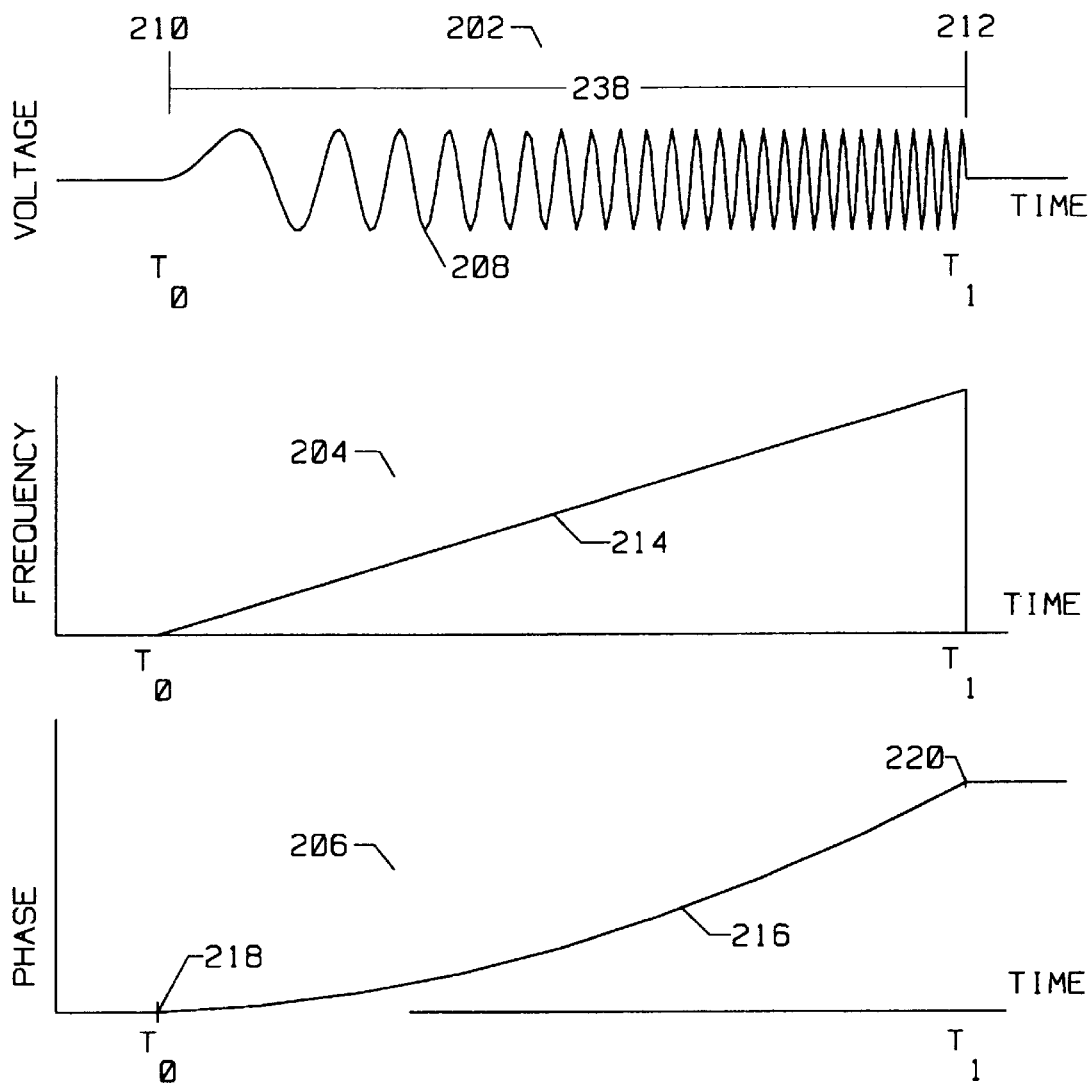
FIG. 2 is an oscillogram of a quadratic chirp.

FIG. 2 illustrates a quadratic chirp which is known in the art. The figure shows an oscillogram plot 202, a frequency vs. time plot 204, and a phase vs. time plot 206. The oscillogram contains a quadratic chirp waveform 208 that operates in a continuous fashion for a major time interval 238 between a start time 210 and a stop time 212. A frequency curve 214 increases linearly and smoothly with time over the major time interval 238 starting at $T_0$ time 210 and stopping at $T_1$ time 212. A phase curve 216 increases phase angle in a smooth quadratic fashion, starting at a phase $\phi_0$ 218 and at time 210 and going to an ending phase $\phi_1$ 220 at time 212. The ending phase $\phi_1$ may be many rotations (multiples of 360 degrees) different from $\phi_0$.

Figure 3:
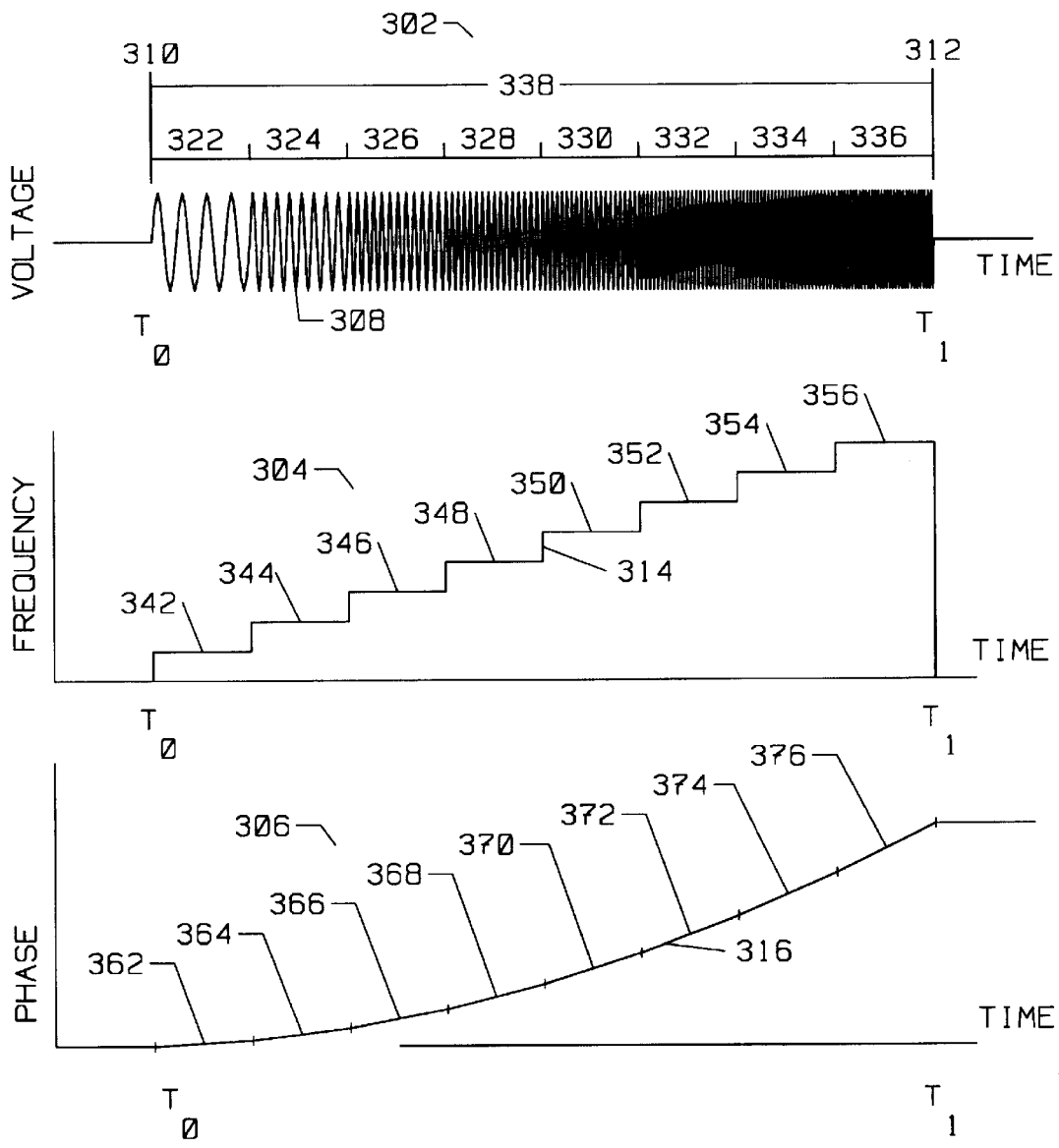
FIG. 3 is a set of plots illustrating a waveform of the present invention with 8 frequency steps.

FIG. 3 shows an illustration of a stepped-frequency waveform 308 that can be created by modifying the frequency of a sine wave in a number of discrete-frequency steps. FIG. 3 shows eight steps. FIG. 3 shows an oscillogram plot 302, a frequency vs. time plot 304, and a phase vs. time plot 306. The stepped-frequency waveform 308 is created by dividing a total major time interval 338 between a start time 310 at $T_0$ and a stop time 312 at $T_1$ into a number of discrete shorter minor time intervals, such as 8 minor time intervals 322, 324, 326 328, 330, 332, 334, and 336. In the first minor time interval 322, the sine wave goes through four cycles and in the second minor time interval 324, the sine wave goes through eight cycles. Four additional cycles are added on each succeeding minor time interval.

A frequency curve 314 illustrates the 8 frequency steps as steps 342, 344, 346, 348, 350, 352, 354, and 356. A phase curve 316 illustrates the result of the 8 frequency steps as 8 straight-line phase segments 362, 364, 366, 368, 370, 372, 374, and 376. Remembering that the frequency is the derivative of phase with respect to time, the slope of any phase segment (362–376) yields the height of the corresponding frequency step (342–356).

As an example, if time samples are being acquired by an A-D converter, or being generated by a D-A converter, the major time interval between start time 310 and stop time 312 may consist of 2048 equally spaced time samples. Since 8 minor time intervals are used, each small time interval will contain 256 samples of each of the 8 frequencies. As a practical limit, the highest frequency in any minor time interval must be less than the Nyqiust rate, which is half of the sampling clock frequency.

During each minor time interval, the waveform oscillates at a uniform rate. Alternately, it could be said that during a minor time interval, the waveform operates at a constant frequency, or spins with constant phase rotation. The waveform may change frequency only at the end of one minor time interval and the beginning of another adjacent minor time interval. Optionally, the phase plot may be continuous during the frequency change. If the phase is continuous the phase does not take a sudden step or have a discontinuity as the frequency shifts.

The frequency shifts may be uniform steps. Alternately, the frequency may take uniform steps except for stepping over or avoiding certain forbidden frequency bands. If this stepped-frequency test signal is being carried over a signal path, such as a cable return system with one or more active return signals, it is desirable for the stepped-frequency waveform 308 to not jam or otherwise disturb any data-transporting carriers. Alternately, the frequency steps may be non-uniform. In the limit, if this stepped-frequency waveform were to have an infinite number of infinitesimally small frequency changes in infinitesimally small time intervals, and with uniform small frequency steps, the stepped-frequency waveform 308 could approach the quadratic chirp waveform 208.

The continuous-phase version of the waveform of the present invention may be described by:

$$\text{for } \ldots t0+<t<t1-v(t)=a\cdot\cos(\omega_0+\omega_0 t) \quad (2)$$

$$\text{for } \ldots t1+<t<t2-v(t)=a\cdot\cos(\omega_1 t+\omega_0(t_1-t_0)+\phi_0) \quad (3)$$

$$\text{for } \ldots t2+<t<t3-v(t)=a\cdot\cos(\omega_2 t+\omega_1(t_2-t_1)+\omega_0(t_1-t_0)+\phi_0) \quad (4)$$

etc.

where 'a' is the amplitude of the oscillation, $\omega$ is the angular velocity, t is time, and $\phi_0$ is the starting phase. The terms $t_0+$ and $t_1-$ are the start and stop times of the first time interval 322, t1+ and t2− are the start and stop time of the second time interval 324, and $t_2+$ and $t_3-$ are the start and stop times of the third time interval 326 etc. The terms:

$$\omega_0(t_1-t_0)+\phi_0 \quad (5)$$

and $$\omega_1(t_2-t_1)+\omega_0(t_1-t_0)+\phi_0 \quad (6)$$

represent the phase of the waveform at the starts of the second and third time intervals respectively. If the phase were non-continuous between minor time intervals, a constant phase offset term would be added to equations (5) and (6).

Thus one general form for a waveform of the present invention with equal duration minor time intervals and continuous phase between minor time intervals is:

$$v(t) = a\cdot\cos\left(\omega_n t + \phi_0 + \sum_{P=0}^{P=n-1} \omega_P \Delta t\right) \quad (7)$$

where $\Delta t$ is the duration of the minor time interval, and P's are previous angular frequencies.

Figure 4:
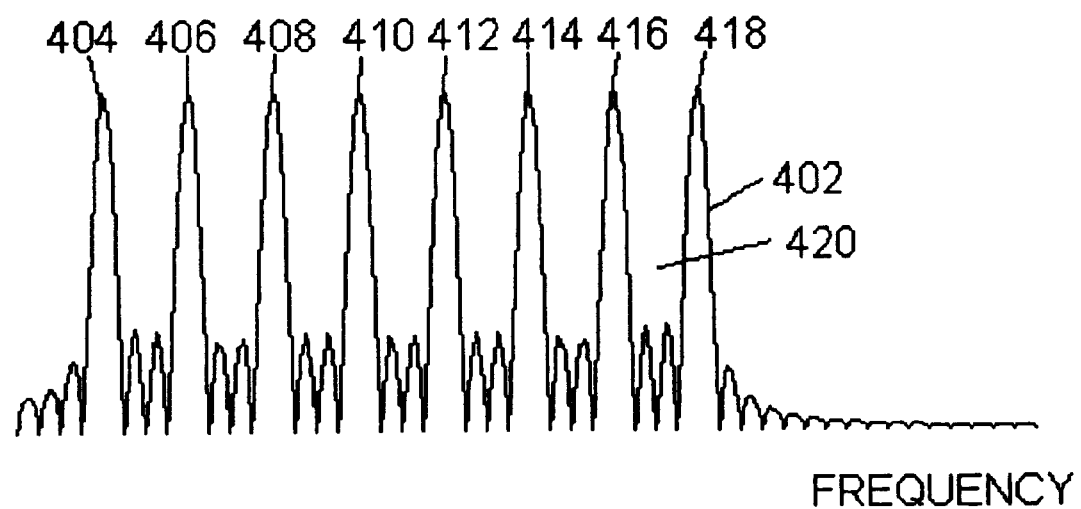
FIG. 4 is a spectral plot of the waveform of FIG. 3.

FIG. 4 shows a spectral plot of the stepped-frequency waveform 308 illustrated in FIG. 3. This spectral plot may be obtained by performing the FFT on the stepped-frequency waveform 308. The vertical scale is linear amplitude. 2048 time-domain time samples of stepped-frequency waveform 308 were used to get 2048 frequency domain samples with each of the 8 frequencies utilizing 256 time domain samples. A spectral plot magnitude trace 402 features 8 evenly-spaced spectral peaks 404, 406, 408, 410, 412, 414, 416, and 418.

Note that it was earlier stated that a good general-purpose reference signal waveform has flat energy density in the frequency domain. The waveform of FIG. 4 has holes at some frequencies, but peaks at other frequencies and is therefore not ideal as a general-purpose waveform. However, this waveform can have advantages for signal path characterization under certain circumstances. For example, a cable television return system is frequently a noisy environment. This waveform, if captured on a digital oscilloscope and converted into the frequency domain via a FIT, would allow the examination and measurement of the complex frequency response of the signal path at the 8 discrete frequencies, and, because the energy in concentrated in only 8 frequencies, noise energy has less effect at each frequency.

This spectral trace is similar to a spectrum produced by a comb signal comprised of a train of impulses. Comb signal generators using impulses are commercially available and are used for reverse cable system balancing and alignment. A comb signal in the time domain transforms into a comb spectrum in the frequency domain and vice-versa. However, since the peak to average power in the stepped-frequency waveform 308 is lower than the impulses comprising a comb, the stepped-frequency waveform is superior because it is much less prone to clip or overload the signal path through a network. Also note that data-carrying signals can be employed in the low-energy areas between the 8 peak-energy frequencies, such as a vacant frequency band 420, since the energy at these frequencies from the stepped-frequency waveform will be low.

Figure 5:
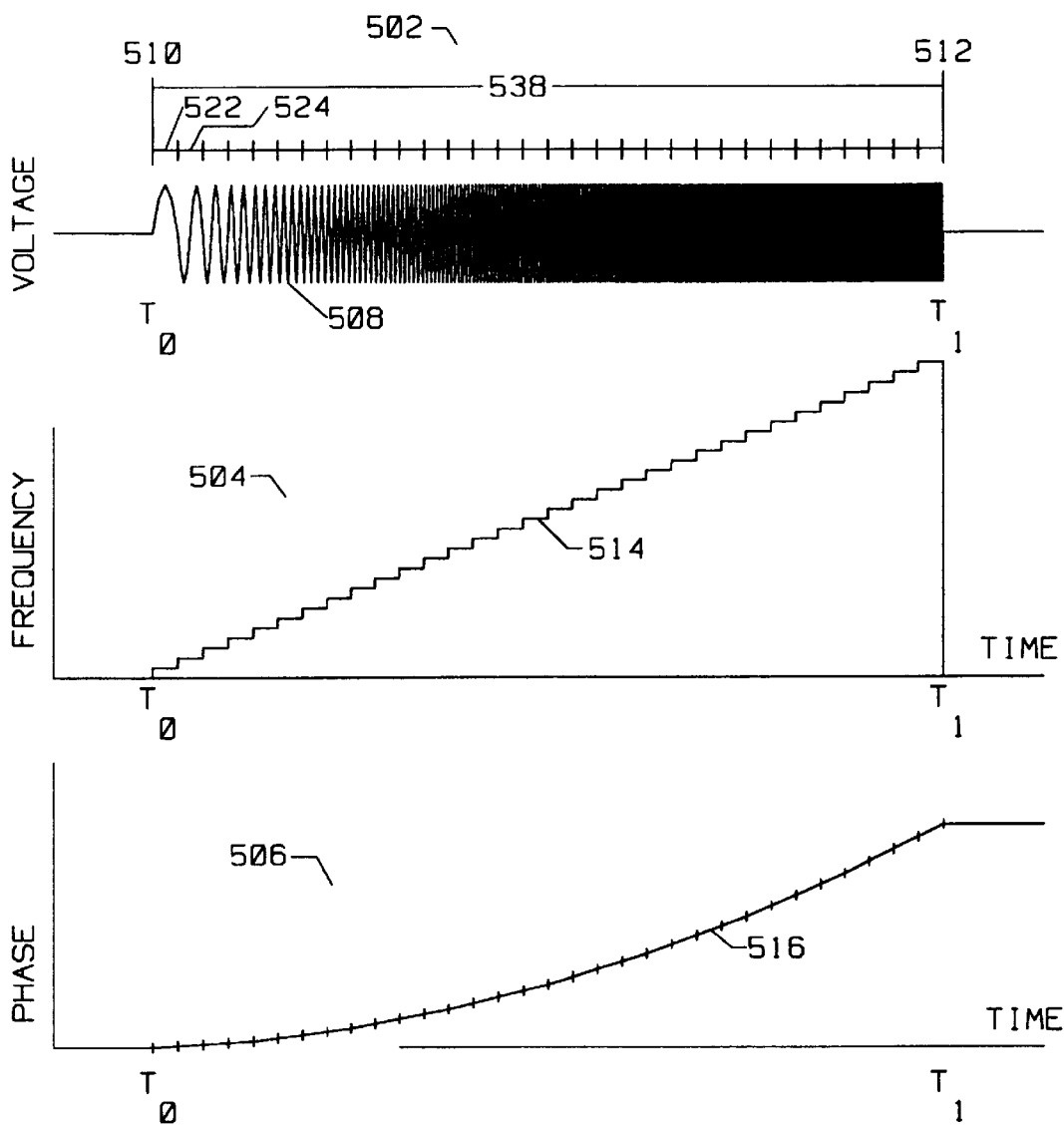
FIG. 5 is an oscillogram of a waveform of the present invention with 32 discrete frequency steps.

FIG. 5 shows an illustration of a stepped-frequency waveform 508 of the present invention. An oscillogram plot 502 has 32 minor time intervals, such as a first minor time interval 522 and a second minor interval 524, which are positioned between a start time marker 510 and a stop time marker 512. A frequency vs. time plot 504 features a stepped-frequency curve 514 which contains more, shorter-duration frequency steps than in the comparable frequency curve 314 illustrated in FIG. 3. A phase vs. time plot 506 features a phase curve 516 that features 32 straight-line phase segments. The stepped-frequency waveform 516 is also phase-continuous, although this is not a requirement.

As another example, if 2048 time samples comprise a major time interval 538, and 32 minor time intervals, such as the first and second minor time intervals 522 and 524, comprise the major time interval 538, each short time interval will consists of 64 time samples. Thus, the waveform of FIG. 3 divides the frequency range into 8 evenly spaced frequency steps of 256 time samples each, and the waveform of FIG. 5 divides the frequency range into 32 evenly spaced frequency steps of 64 time samples each.

Figure 6:
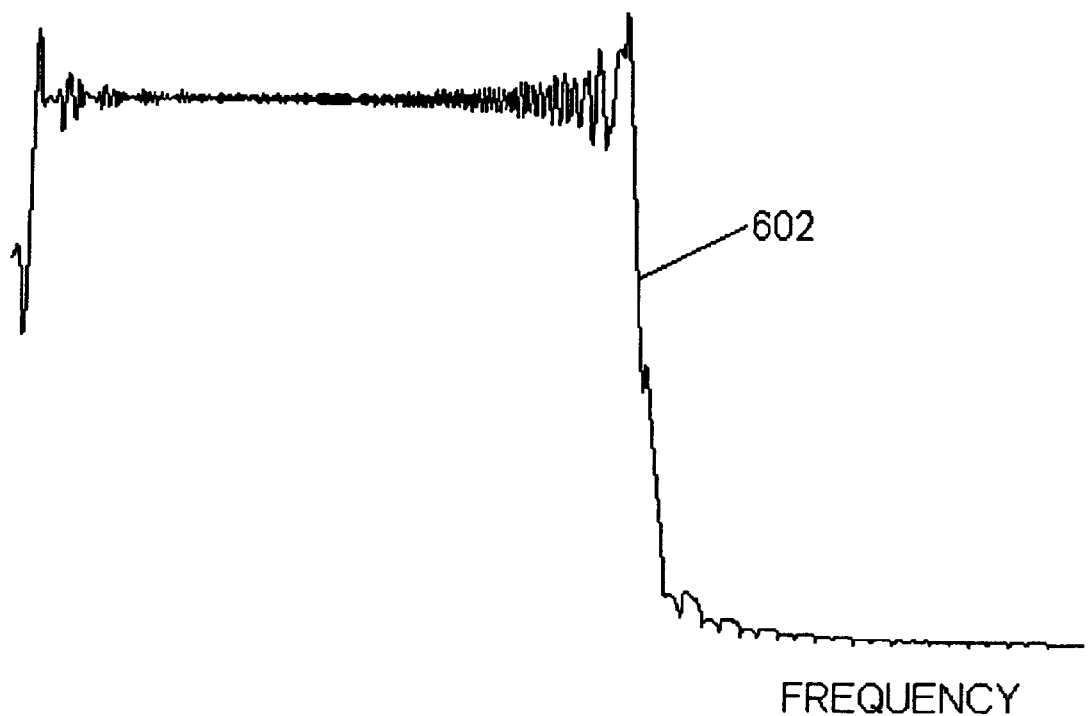
FIG. 6 is a spectral plot of the waveform of FIG. 5.

FIG. 6 shows a spectral plot 602 of the stepped-frequency waveform 508 illustrated in FIG. 5. This spectral plot was obtained by performing the FFT on the stepped-frequency waveform 508. 2048 time domain time samples of stepped-frequency waveform 508 were used to get 2048 frequency domain samples with each of the 32 frequencies utilizing 64 time domain samples. Note that this waveform makes a good reference signal because there are no deep holes at any frequency and the energy is uniform, especially in the mid-frequency range. The reason that the spectral plot 602 does not appear as 32 vertical lines is because of "leakage" that causes the null-frequency spectrum to "fill-in" with energy of side-lobes. Leakage is related to time-domain truncation and is explained in *The Fast Fourier Transform* by E. Orin Brigham (Prentice Hall, 1974). The "fill-in" phenomena causes the stepped-frequency waveform 508 to have relatively flat frequency-domain spectral energy, making it an excellent general purpose reference signal. Experimentation with minor time interval duration shows that the "fill-in" is better if the frequency burst in the minor time interval stops on an even number of cycles or even partial cycles. For example, in the first minor time interval 522 the sine wave makes a half cycle (180°) and in second minor time interval 524 the sine wave makes one full cycle (360°), and another half cycle (180°) is added on each succeeding minor time interval.

Figure 7:
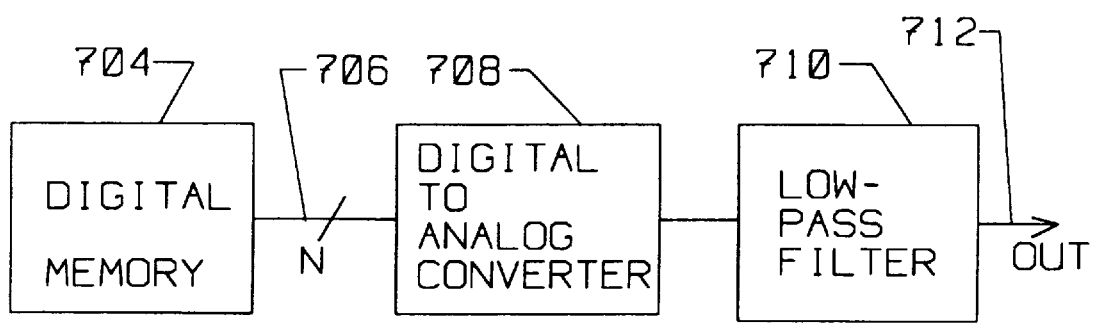
FIG. 7 is a block diagram of a conventional method of generating reference signals.

FIG. 7 shows a block diagram of a method of generating the stepped-frequency waveform. The time samples are read out of a digital memory 704 and applied to a bus 706 connected to an digital-to-analog (D-A) converter 708. The output of the D-A converter must be filtered by means of a low-pass filter 710 to remove the unwanted "repeat spectra" or aliased components at higher frequencies. The output signal is applied to an output lead 712. This method can be used to generate any arbitrary waveform, and commercially available instruments that generate similar waveforms are called arbitrary function generators. In accordance with sampling theory, the sample rate used by the D-A converter should be greater than twice the cut-off frequency of the low-pass filter. As an example, a 0–42 MHz stepped-frequency reference signal could be generated with a sample rate of 100 M samples/sec. utilizing a 42 MHz low-pass filter.

Another way to generate this stepped-frequency reference signal waveform is by rapidly reprogramming a numerically controlled oscillator(NCO). Numerically controlled oscillators are known in the art and available in IC form from vendors such as Analog Devices and Stanford Telecom. One Analog Devices part number that works in accordance with the present invention is AD9850. It is also available in evaluation kit form as AD9850/FSPCB. The signal generation technique is also known as direct digital synthesis (DDS). The advantage of using a NCO IC is lower parts count due to a higher level of integration inside the commercially available ICs. The higher level of integration results in lower parts cost, lower power consumption, less printed wiring board area, less electrical noise, and higher reliability. Another Analog Devices IC that may be used is the AD7008.

Figure 8:
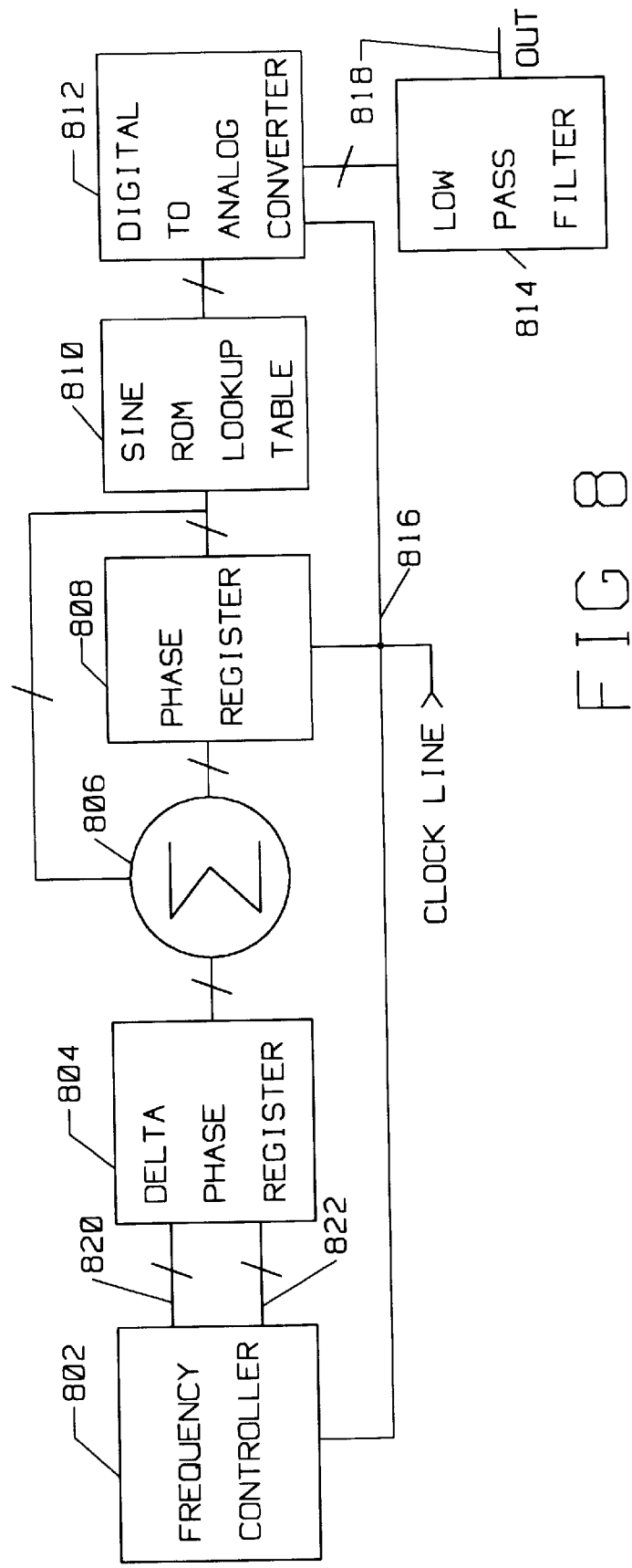
FIG. 8 is a block diagram of a numerically controlled oscillator which has its frequency controlled by a frequency controller.

FIG. 8 shows a block diagram of a NCO that is controlled by a frequency controller 802 to generate the stepped-frequency waveform of the present invention. A description of the theory of operation of NCOs is given in *High Speed Design Techniques* published by Analog Devices in Section 6 (1996, ISBN-0-916550-17-6). The frequency controller 802 programs the NCO to step in frequency. The frequency controller 802 provides a data lines bus 820 and a control lines bus 822 to control and re-program a delta phase register, 804. A NCO is a digital circuit that comprises the delta phase register 804, an adder, or summer 806, a phase register 808, a sine ROM lookup table 810, and a digital-to-analog converter (D-A) 812. A low-pass filter 814 removes aliased components. A clock line 816 operating at a relatively high clock frequency such as 100 MHz. is applied to the phase register 808, the frequency controller 802, and the D-A 812.

The NCO operates by adding the output of the phase register 808 to the value stored in the delta phase register 804 on each clock cycle, and then storing the sum back into the phase register 808. In other words, the sum is accumulated in the phase register 808. The value stored in the delta phase register 804 is proportional to the frequency being generated. The change in phase generates the output frequency of the NCO. Thus, the output of the phase register is a digital word representing the instantaneous phase of the signal. The digital phase value is converted into a digital sine wave by the ROM lookup table 810. This digital sine wave is converted into analog form by the D-A converter 812, which is then low-pass filtered by the low-filter 814. An output lead 818 provides the output signal that may optionally need to be amplified or up-converted in frequency before application to a signal path under test.

If the delta phase register 804 has a large value, then the phase register 808 increments in large steps on each clock cycle, which causes the generation of a high-frequency signal. If the delta phase register 804 has a small value, then the phase register 808 increments in small steps on each clock cycle, which causes the generation of a low frequency signal.

In one embodiment using the Analog Devices AD9850, the delta phase register 804 may be loaded in a parallel fashion with 8 bits of data that are generated by the frequency controller 802. Optionally, the frequency controller 802 may employ a digital counter. Only 8 of the 32 AD8950's frequency control bits are used in the present embodiment. Additionally, the parallel data is loaded as the second of five words on the AD9850. The first word has some hidden factory test codes and must by all 0's. It is not necessary to load the last three words with the AD9850 in the current embodiment.

The AD9850 has a built-in phase modulation ability with 32 phase states. If desired, at the end of a minor time interval, the phase may be optionally changed in 11.25 degree increments. However the phase is continuous across minor time intervals in the present embodiment.

Figure 9:
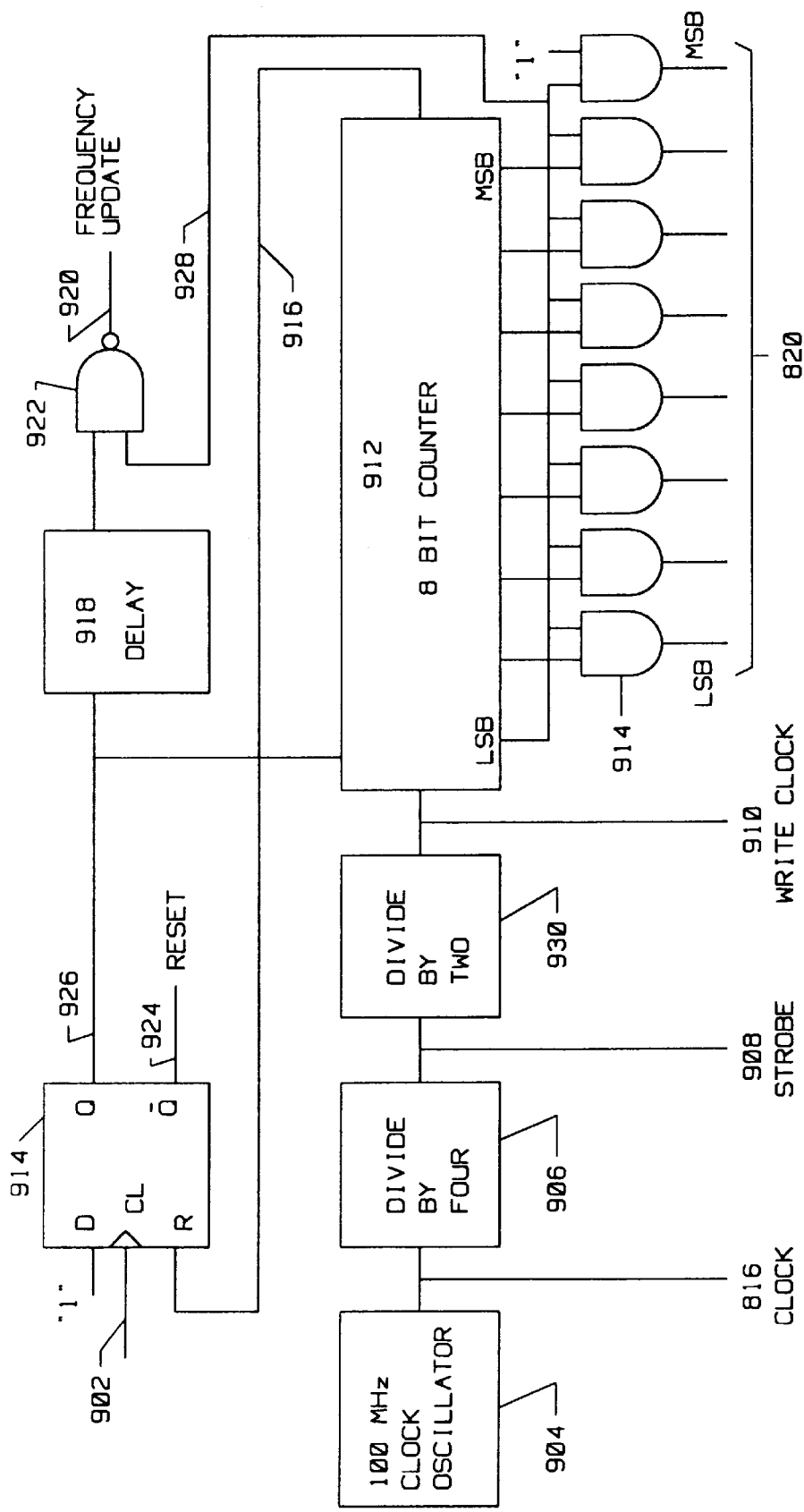
FIG. 9 is a block diagram of a frequency controller circuit for controlling a numerically controlled oscillator.

FIG. 9 shows a block diagram of a frequency controller circuit which may be used as the frequency controller 802. The function of the block diagram is to create a stepped-frequency waveform by rapidly reprogramming the AD9850 IC via its parallel 8-bit bus. The control word is a 40-bit register, but only the first two bytes (16 bits) of the control word must be loaded before updating the frequency inside the IC.

This block diagram generates a frequency stepped-waveform of the present invention with flat energy content up to the corner frequency of the low-pass filter, which is approximately 42 MHz in the present embodiment, using a clock oscillator 904 of 100 MHz. In the first minor time interval, the circuit starts with a high frequency and works its way downward to a low frequency in the last minor time interval. This block diagram controls the AD9850/FSPCB evaluation board supplied by Analog Devices to rapidly reprogram the NCO. Although the frequency controller description is specific to one particular integrated circuit, which will, in time, likely be dropped, upgraded, or replaced, the description is not meant to limit the scope of the invention to one vendor's product, but rather to be one description of how a NCO can be rapidly reprogrammed to build the present invention. The Analog Devices AD9850 data sheet, which includes the schematic diagram for the AD9850/FSPCB evaluation board, should be used as a reference.

The frequency controller block diagram of FIG. 9 may be implemented in discrete logic ICs. This circuit may alternately be built into a programmable logic device (PLD) to reduce parts count. Another way to build the frequency controller 802 is to design a circuit that plays the next frequency value out of a programmable ROM, such as a 27C64, which contains the frequency programming information as 8 bit stored words. Yet a forth way to build a frequency controller is to use a microprocessor. A fast microprocessor must be used because the frequency update rate in the present embodiment is fast (160 ns.).

The frequency controller block diagram loads the AD9850/FSPCB evaluation board with a new frequency value every 160 nanoseconds. To start a reference signal transmission a start lead 902 goes high to toggle a run flip-flop 914. The inverting output 924 of flip-flop 914 goes low to release the reset of the AD9850/FSPCB evaluation board, while the non-inverting output 926 releases the reset line on an 8-bit counter 912. A delay block 918 inhibits a frequency update line 920 via "and" gate 922 until the highest desired frequency is reached. This particular embodiment counts downward in frequency, as mentioned above.

The clock oscillator 904 operates at 100 MHz and clocks both the AD9850/FSPCB evaluation board and the frequency controller block diagram via the clock line 816 in the block diagram of FIG. 8. The 100 MHz clock oscillator 904 is divided by 4 by a divide by four block 906 to provide a 25 MHz strobe lead 908 which is also applied to the evaluation board. The clock is divided by two again to provide a 12.5 MHz write clock 910 lead for the evaluation board. The 12.5 MHz clock is also connected to the 8 bit counter 912. The 8bit counter counts for 255 counts, and the flip-flop 914 is reset by carry lead 916. An array of eight "and" gates, such as an "and" gate 914, are used to apply a first word, which is all 0's to the data bus 820 followed by the frequency data generated by the 8 bit counter. The least significant bit 928 (LSB) out the 8-bit counter's output may be used for strobing the "and" gates, and the 7 most significant bits (MSB) may be used for frequency updates. The most significant frequency update bit is a "1". After the two bytes on data bus 820 are clocked into the AD9850 IC over control bus 822, the two words are loaded when the frequency update lead 920 strobes. The write clock 910, the strobe 908, the frequency update 920, and the reset lead 924 comprise the control bus 822.

The duration of the reference signal in this embodiment is approximately 17.92 microseconds, so 112 minor time intervals are generated, which is 128 less 16 minor time intervals used by the delay block 918. This particular circuit uses 390.625 kHz steps. The FFT of the captured waveform from this circuit reveals a flat frequency spectrum because of the "leakage" as described above.

The Analog Devices data sheet reveals that the reference signal, $V_{erve}$ utilized by their IC can be used for amplitude modulation. If the output waveform is amplitude modulated while it is changing frequency, by changing $V_{erve}$ or by other means, the waveform can be equalized or windowed. Windowing is a technique well known in the art and can be used to force both ends of a waveform to the same voltage. Equalization can be used to produce a tilt which varies with frequency to, for example, correct for cable loss.

Another feature of NCOs is the ability to be modulated to transmit digital information. The modulation may be of several types including frequency shift keying (FSK), binary phase shift keying (BPSK), amplitude modulation (AM), and QPSK. Thus, the NCO of the present invention can have a dual use of sending modulated data over the signal path in order to establish a communications link with the receive site, as well as generating a test signal.

Currently NCOs are being used in home terminal devices such as cable modems and set top boxes employed in HFC cable systems to generate a QPSK (quadrature phase shift keying) upstream signal for the return-band transmission from a home back to a cable headend. The use of NCOs for digital modulation offer several advantages, such as low phase noise, full frequency agility, low cost, precise waveforms, and they are easy to modulate. The NCOs in home devices can easily be programmed to send reference signals according to the present invention back to the headend to test the upstream frequency response and check for the presence of clipping or non-linear distortion. Thus the signal path between every home with a cable modem and the headend can potentially be tested with this invention for small additional cost if the software and/or hardware to rapidly reprogram the existing NCO is added to the home terminal device.

Distortion Measurement

It is possible to use the waveform of the present invention to detect the signal level at which the network starts operating in a non-linear mode or clipping. This can be done by elevating the test signal until network elements, such as amplifiers and laser transmitters, begins to clip or generate non-linear distortion.

The spectral energy of the stepped-frequency waveform of the present invention can be driven to low levels at notch frequencies. At the receive site, the notch frequencies can be inspected for the presence of distortion energy. The inspection can be done by capturing a distorted waveform in the time domain using a digital signal acquisition unit, such as a digital storage oscilloscope, and converting the waveform into the frequency domain via the FFT. In the frequency domain the depth of the notch can be measured. If the stepped-frequency waveform is repeatedly transmitted into the transmission medium at a high rate, a conventional spectrum analyzer can be use to display the level of distortion energy in the notch. The spectral notch can be generated by three methods.

The first method of reducing spectral energy at some frequencies is to use amplitude modulation to reduce or collapse the waveform to a low value while stepping through the selected notch frequencies.

The second method is to use the stepped-frequency waveform of the present invention to generate a spectral "hole"0 or notch by stepping over a set of notch frequencies. The distortion products, which at any instant in time will be harmonics of the instantaneous stepped sine wave frequency, will fill-in the spectral notch where the stepped-frequency waveform was programmed to create the notch. Ideally, the notch frequencies selected for this test should be positioned towards the middle to upper end of the utilized frequency band, since the distortion components created by this test method will have energy at the harmonic frequencies of the instantaneous stepped-frequency waveform's frequency, such as the 2nd, 3rd, 4th etc. harmonics.

The third method is to use an external notch filter located between the transmitter and the signal path.

Another novel way to measure the presence of non-linear distortion in a reference signal waveform is to examine the impulse response of the reference signal after it has been passed through the signal path and analyzed.

Figure 10:
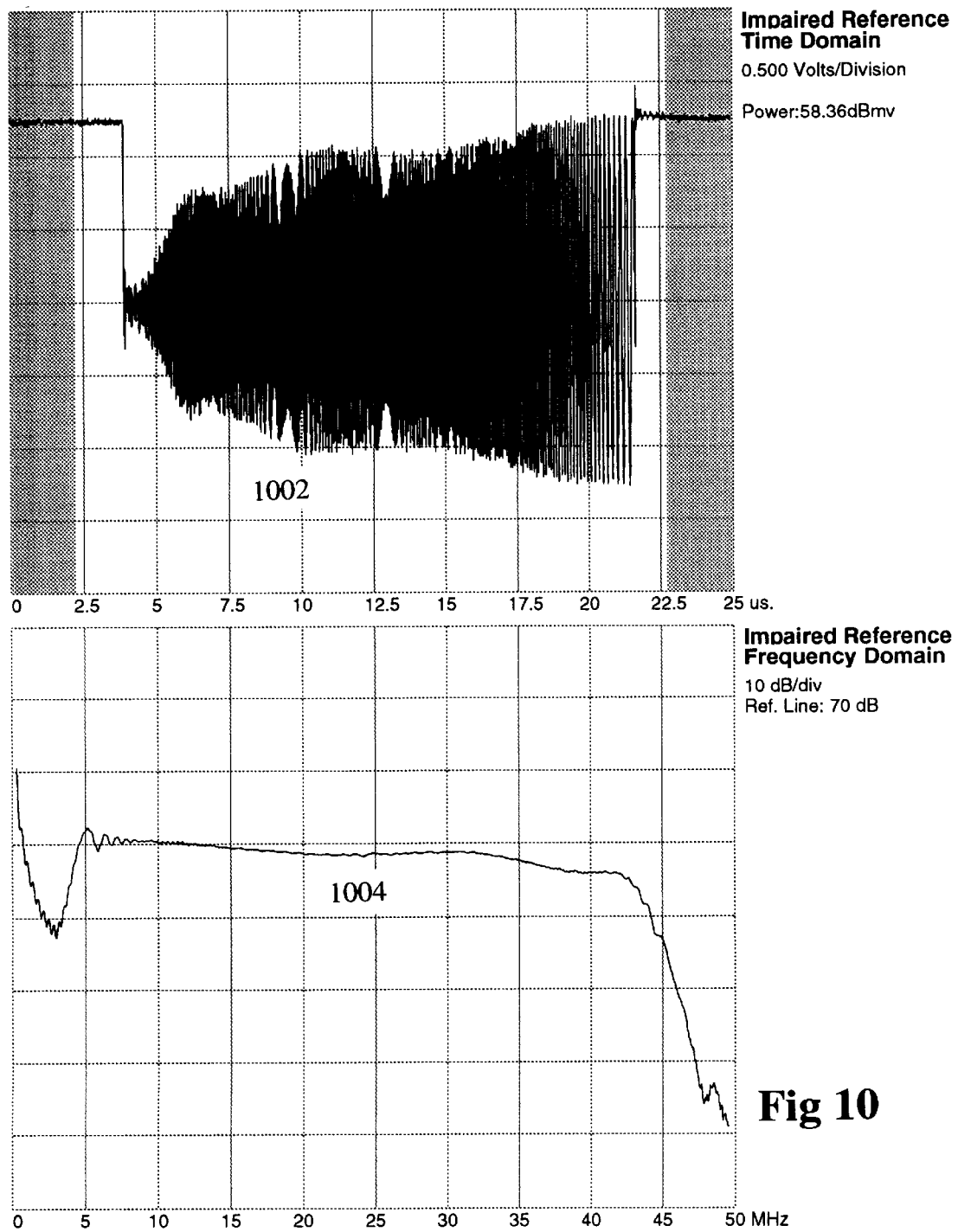
FIG. 10 is stepped-frequency waveform displayed as a time plot and a spectral plot.

FIG. 10 shows two traces of a stepped-frequency waveform. The upper trace is a stepped-frequency waveform 1002 in the time domain generated by the block diagrams of FIGS. 8 and 9 and captured on a digital storage oscilloscope. The horizontal axis is time from 0 to 25 microseconds, and the vertical axis is linear voltage. The lower trace 1004 is a stepped-frequency waveform's spectral trace obtained by performing a FFT on the stepped-frequency waveform 1002. The horizontal axis is frequency displayed from 0 to 50 MHz. and the vertical axis is logarithmic voltage. A 42 MHz low-pass filter located between the transmitter and the receiver attenuated any energy above 42 MHz. The non-flatness in the frequency response was caused primarily by the low-pass filter. The stepped-frequency waveform starts at a high frequency and goes to a low frequency.

Figure 11:
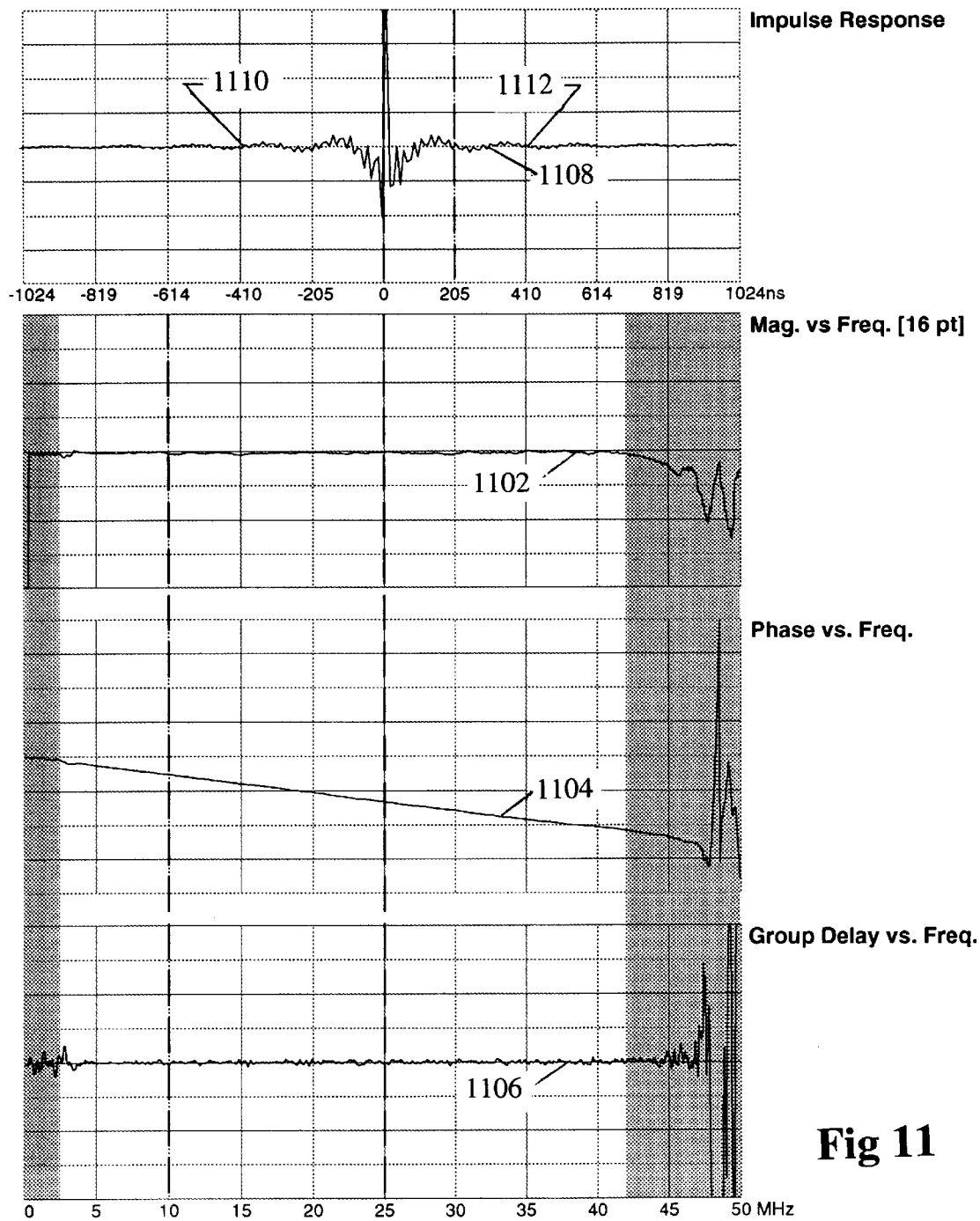
FIG. 11 is a linear frequency response analysis using a stepped-frequency waveform.

FIG. 11 shows three traces that were obtained by processing an impaired stepped-frequency waveform with the unimpaired waveform 1002 to obtain the complex linear frequency response. A magnitude trace 1102 is a plot of linear magnitude vs. frequency. A phase trace 1104 is a plot of phase vs. frequency, and a group delay trace 1106 is a plot of group delay vs. frequency. The group delay is simply the slope of the phase response with respect to frequency. The magnitude trace 1102 and the phase trace 1104 comprise the linear frequency response. If the linear frequency response is transformed into the time domain with the IFFT, the impulse response trace 1108 is obtained. The impulse response is a plot of linear voltage vs. time. The time interval displayed for the impulse response trace 1108 is only about 10% of the total duration of the impulse response. The remainder is essentially flat if the signal path does not contain long echoes or non-linear distortion.

If the transmission medium creates non-linear distortion, the impulse response will take on a "rough" or "choppy" appearance because of the addition of non-linear distortion energy. The non-linear distortion energy will not be correlated with the impulse, so the energy will be relatively evenly distributed over the total time interval of the impulse response, which is 20.48 microseconds in this example.

Assuming that the energy of the impulse response is mostly contained between a first time 1110 and a second time 1112, the linear energy of the signal can be calculated. The calculation is done by measuring the voltage associated with each time sample between the first time 1110 and the second time 1112, squaring each value and summing them together. The non-linear energy can be estimated by measuring the voltage associated with each impulse response time sample not between the first time 1110 and the second time 1112, squaring each value and then summing them together. If the ratio is taken between the calculated linear and calculated non-linear energy, the signal to distortion ratio can be measured in a channel.

The non-linear energy measurement can be improved adjusting the measurement upwards for the non-linear energy located between the first time 1110 and the seconds time 1112 that has not been included in the calculation, assuming the distortion energy is evenly distributed in the impulse response. For example, if the time difference between the first time 1110 and the second time 1112 is 5% of the total time, the total non-linear energy estimate is increased by 5%. Likewise the linear energy measurement can be corrected by subtracting an estimate of the non-linear energy in the time interval between first time 1110 and second time 1112 from the linear energy. This distortion measuring technique also works with other types of reference signals, such as PN sequences and the Koo waveform.

In summary, energy that is created by non-linear distortion will be uncorrelated with the linear energy on the impulse response, and can be accurately quantified for a measure of signal-to-distortion plus noise by measuring the energy close in time to the peak of the impulse response, relative to the energy that is not close in time to the peak of the impulse response. Because this distortion energy can be measured, and because the energy associated with the impulse response can also be measured, the signal to noise can be calculated. As the signal path is clipped harder, the signal-to-noise ratio generally becomes lower. The stepped-frequency waveform of the present waveform can also be used to perform this test without any requirement for either a notch filter or a programmed hole in the spectrum.

Summary Ramifications and Scope

Although the description above contains many specificities, these should not be construed as limiting the scope of the invention but as merely providing illustrations of some of the presently preferred embodiments of this invention. For example:

1. Another function that a waveform of the present invention can be made to perform is to run continuously. That is, one total time period is followed without delay by another, and so forth. This continuous waveform can be viewed on a conventional swept spectrum analyzer, so the scalar frequency response of a network or a device under test can be observed.

2. The notched-frequency distortion test can also be performed on a conventional spectrum analyzer with the notched waveform of the present invention. This can be done by running continuously while generating a waveform with a notch.

3. Another use of NCOs is to build spread-spectrum frequency-hopping systems. These communications systems are used by the military and others to provide a signal that is difficult to detect and jam. The frequency jumps of a frequency hopping spread spectrum signal can also be used as a reference signal in accordance with the present invention provided that the signal is repeatable over the time interval, and the spread-spectrum signal provides high energy over the frequency band for which a frequency response characterization is desired.

4. If the reference signal does a stepped sweep from a low frequency to a high frequency, or vice versa, the waveform can be viewed directly on an oscilloscope for the magnitude component of the frequency response. The magnitude component of the frequency response at any frequency will be the magnitude of the waveform's envelope. Thus the captured signal may be evaluated simply by a direct observation of the oscillogram.

5. In the Cable Scope test system, a burst sine wave, which may be at 25 MHz with a duration of 5 $\mu$sec., is transmitted from the transmitter just before the reference signal is transmitted. The purpose of the sine wave burst is to remotely trigger the data acquisition unit located at the headend so that it will capture the impaired reference signal. The NCO used in accordance with the present invention can easily generate this burst sine wave signal at 25 MHz. or any other desired frequency.

6. It should be recognized that a sine wave and a cosine wave are the same except for a 90° phase shift. For purposes of this invention, the two functions are generally interchangeable.

7. The notch frequencies for use in a non-linear distortion test may be located at the highest frequencies in the spectral plot. In this case, the notch will simply be the frequency range just above the highest burst frequency.

8. Sampled data is known to have a characteristic known as "repeat spectra". If the lowpass filters of FIGS. 7 or 8 are replaced with a bandpass filter, the waveform of the present invention can be generated at a with a high-frequency offset. The signal coming out of the bandpass filter can be used to test a high-frequency channel without the requirement of up-conversion using a linear modulator. Likewise the property of "repeat spectra" can be used at the receive site by a sub-sampled A-D converter to receive a high-frequency narrow-band signal, thereby avoiding the cost of a down-converter circuit.

I claim:

1. A system for measuring a linear frequency response of a transmission medium, the system comprising:
   a transmitter for transmitting an unimpaired reference signal into the transmission medium, the unimpaired reference signal comprising
      a major time interval comprising at least two minor time intervals, and
      a sine wave operating at a constant frequency during each minor time interval wherein the constant frequency for each time interval is different from the constant frequency of any other adjacent minor time interval,
   a receiver connected to the transmission medium, at a location different from the location wherein the transmitter is connected, for receiving an impaired reference signal from the transmission medium;
   a processor connected to an output of the receiver for computing a linear frequency response from the impaired and unimpaired reference signals.

2. A system for measuring linear frequency response according to claim 1 wherein the linear frequency response is displayed to a user of the system.

3. A system for measuring linear frequency response according to claim 1 wherein the linear frequency response is further processed to program an adaptive equalizer.

4. A system for measuring linear frequency response according to claim 1 wherein a starting phase of a sine wave signal in any minor time interval is the same as an ending phase of a sine wave in a preceding minor time interval.

5. A system for measuring linear frequency response according to claim 1 wherein the at least two minor time intervals are of the same duration.

6. A system for measuring linear frequency response according to claim 1 wherein a frequency of each time interval is selected to provide a uniform spectral energy in the reference signal.

7. A system for measuring linear frequency response according to claim 1 wherein the transmitter further comprises a numerically controlled oscillator programmed to generate the reference signal.

8. A system for measuring frequency response according to claim 1 wherein the transmitter further comprises a digital-to-analog converter that retrieves data from a digital memory to generate the reference signal.

9. A system for measuring frequency response according to claim 1 wherein the frequency response is determined by a measurement from an oscilloscope trace.

10. A system for measuring linear frequency response according to claim 1 wherein the transmission medium includes:
    (a) a coaxial cable plant that is being tested
    (b) a transformer for magnetically inducing the unimpaired reference test signal onto the sheath of a coaxial cable plant comprising:
        (1) a primary winding connected to the reference test signal transmitter
        (2) a secondary winding which is a section of the coaxial cable plant
        (3) a magnetic coupling device which magnetically couples the primary and the secondary windings
   whereby a center conductor signal is received if there is the shield break.

11. A system for measuring linear frequency response according to claim 1 wherein a change in frequency between sine waves in any two adjacent minor time intervals is equal to a change in frequency between sine waves of any other two adjacent minor time intervals.

12. A system for measuring linear frequency response according to claim 11 wherein the numerically controlled oscillator is located in a home terminal device.

13. A system for measuring a non-linear distortion of a transmission medium, the system comprising:
    a transmitter for transmitting an unimpaired test signal into the transmission medium, the unimpaired test signal comprising
       a major time interval having at least two minor time intervals, and
       a sine wave operating at a constant frequency during each minor time interval wherein the constant frequency for each time interval is different from the constant frequency of any other adjacent minor time interval,
    a receiver connected to the transmission medium, at a point different from a location wherein the transmitter is connected, for receiving the reference signal;
    a processor connected to an output of the receiver for computing non-linear distortion from the received test signal; and
    a spectral notch filter located between the transmitter and the signal path wherein non-linear distortion of the transmission medium is determined by the amount of additional energy measured in the spectral notch.

14. A system for measuring a non-linear distortion of a transmission medium comprising
    a transmitter for transmitting an unimpaired reference signal through the transmission medium, the unimpaired reference signal comprising
       a major time interval having at least two minor time intervals, and
       a sine wave operating at a constant frequency during each minor time interval wherein the constant frequency for each time interval is different from the constant frequency of any other adjacent minor time interval,
    a receiver connected to the transmission medium, at a point different from a location wherein the transmitter is connected, for receiving the reference signal;
    a processor connected to an output of the receiver for computing an impulse response of the reference signal, wherein the non-linear distortion of the transmission medium is determined by an amount of uncorrelated energy in the impulse response.

* * * * *